United States Patent
Kim et al.

(10) Patent No.: US 12,228,605 B2
(45) Date of Patent: Feb. 18, 2025

(54) MODULE TYPE SENSOR FOR DETECTING VOLTAGE AND CURRENT OF RADIO FREQUENCY SIGNAL ON PCB TRANSMISSION LINE

(71) Applicant: Newpowerplasma Co., Ltd., Suwon-si (KR)

(72) Inventors: Jinjoong Kim, Suwon-si (KR); Donggeun Noh, Osan-si (KR)

(73) Assignee: NEWPOWERPLASMA CO., LTD., Suwon-si (KR)

( * ) Notice: Subject to any disclaimer, the term of this patent is extended or adjusted under 35 U.S.C. 154(b) by 192 days.

(21) Appl. No.: 17/982,266

(22) Filed: Nov. 7, 2022

(65) Prior Publication Data

US 2023/0160946 A1    May 25, 2023

(30) Foreign Application Priority Data

Nov. 19, 2021    (KR) .......................... 10-2021-0160810

(51) Int. Cl.
*G01R 31/28*    (2006.01)
*H05K 1/02*    (2006.01)

(52) U.S. Cl.
CPC ....... *G01R 31/2818* (2013.01); *H05K 1/0237* (2013.01); *H05K 2201/10022* (2013.01);
(Continued)

(58) Field of Classification Search
CPC .............. G01R 31/2818; H05K 1/0237; H05K 2201/10022; H05K 2201/1003;
(Continued)

(56) References Cited

U.S. PATENT DOCUMENTS

2011/0025348 A1*    2/2011    Chetham ................ A61B 5/053
                                                        324/649
2018/0090809 A1*    3/2018    Holt ........................ H01P 5/107
(Continued)

FOREIGN PATENT DOCUMENTS

JP    2009-080042 A    4/2009
JP    2012-242350 A    12/2012
(Continued)

OTHER PUBLICATIONS

Communication from Korea Intellectual Property Office in a counterpart foreign application KR10-2021-0160810.

*Primary Examiner* — Raul J Rios Russo
*Assistant Examiner* — Trung Q Nguyen
(74) *Attorney, Agent, or Firm* — You & IP, LLC

(57) ABSTRACT

A module type sensor includes a casing including a casing upper surface, a first casing side surface which is bent downward from the casing upper surface and has a lower end upwardly separated from a path through which a transmission line passes, and a second casing side surface which is bent downward from the casing upper surface and has a fixing bracket extending by being outwardly bent; a body unit fixedly installed inside the casing, formed of an insulator, supported by the printed circuit board at a lower end, and having, at a center, an opening which is open toward the transmission line; and a sensing substrate unit fixedly installed on an upper portion of the body unit, and including a voltage sensing circuit which is capacitively coupled to the transmission line exposed through the opening and a current sensing circuit which is inductively coupled to the transmission line.

13 Claims, 4 Drawing Sheets

(52) U.S. Cl.
CPC ............... *H05K 2201/1003* (2013.01); *H05K 2201/10098* (2013.01); *H05K 2201/10151* (2013.01); *H05K 2201/10371* (2013.01); *H05K 2201/10409* (2013.01)

(58) Field of Classification Search
CPC .......... H05K 2201/10098; H05K 2201/10151; H05K 2201/10371; H05K 2201/10409
USPC ....... 324/500, 537, 329–348, 323, 447, 425, 324/200, 206, 256–259, 600, 637, 639, 324/658, 750.12, 76.11, 763.01
See application file for complete search history.

(56) References Cited

U.S. PATENT DOCUMENTS

2018/0231587 A1* 8/2018 Ye .................... H01J 37/32174
2019/0364658 A1* 11/2019 Ammar ............. H01Q 21/0025

FOREIGN PATENT DOCUMENTS

| JP | 2016-178415 A | 10/2016 |
| KR | 101099663 B1 | 12/2011 |
| KR | 101257980 B1 | 4/2013 |
| KR | 10-2016-0039009 A | 4/2016 |
| KR | 10-2016-0137294 A | 11/2016 |
| KR | 101787420 B1 | 10/2017 |

* cited by examiner

MODULE TYPE SENSOR FOR DETECTING VOLTAGE AND CURRENT OF RADIO FREQUENCY SIGNAL ON PCB TRANSMISSION LINE

BACKGROUND

1. Technical Field

Various embodiments generally relate to a module type sensor for detecting a voltage and a current of a radio frequency (RF) signal on a transmission line of a printed circuit board (PCB), and more particularly, to a module type sensor having a new structure capable of being easily attached to and detached from a printed circuit board and easily adjusting the distance between a sensing circuit unit and a transmission line according to the magnitude and frequency of power of the transmission line while maintaining insulation for the transmission line.

2. Related Art

Plasma discharge is used for gas excitation to produce an active gas containing ions, free radicals, atoms or molecules. The active gas is widely used in various fields. Typically, the active gas is used in a large-screen display manufacturing process or a semiconductor manufacturing process, for example, etching, CVD (chemical vapor deposition) and ashing processes.

A general plasma power supply system is largely composed of a high-frequency power supply device which supplies power, an impedance matching device or cable for maximum power supply, and a plasma load. The high-frequency power supply device receives commercial power, converts the commercial power into DC power, amplifies the DC power into a high-frequency signal, and supplies the high-frequency signal to the plasma load.

In general, the impedance of the output terminal of the high-frequency power supply device is usually fixed at 50 ohms, whereas the impedance of the plasma load variously changes. In order to match the impedances of a power supply terminal and a load terminal, a method of changing the frequency of the power supply terminal or changing the impedance of the impedance matching device is being used. When the impedances of the power supply terminal and the load terminal are matched, the reflected wave reflected from the plasma load to a power source may be reduced, damage to an RF generator may be prevented, and high-frequency RF power may be fully used without loss in a processing chamber.

In general, a voltage-current sensor is installed on a transmission line which transmits a radio frequency (RF) signal, to monitor the RF signal at various points such as a high-frequency power generation unit, a power output unit and a power input unit of a load. The conventional voltage-current sensor includes a current probe and a voltage probe, and has a structure in which a through hole is formed on a printed circuit board (PCB) and the current probe and the voltage probe are patterned around the through hole. For example, Korean Patent No. 10-1787420 entitled "On the Enhancements of Plasma Based RF Sensor Technology," Korean Patent No. 10-1257980 entitled "Orthogonal Radio Frequency Voltage/Current Sensor with High Dynamic Range" and Korean Patent No. 10-1099663 entitled "Sensor for Measuring Electrical Characteristics" exemplify a voltage-current sensor installed on a transmission line which transmits a high-frequency RF signal.

However, in the above-described conventional sensors, the transmission line should be installed to pass through the through hole formed on the PCB, and a problem is caused in that such an installation structure is complicated. Also, in the conventional sensors, voltage probes which are patterned on the outer surface of the transmission line and the inner surface of the through hole should maintain a constant distance. To this end, the transmission line needs to be installed to be necessarily coaxially arranged with the through hole, and thus, a problem is caused in that precise position adjustment is necessary when installing a sensor. Furthermore, when the alignment disposition of a sensor is even slightly changed due to an impact applied while a device is being operated or the aging of parts, a problem is caused in that an error occurs in a sensing signal.

PRIOR ART DOCUMENT

Patent Document

Korean Patent No. 10-1787420
Korean Patent No. 10-1257980
Korean Patent No. 10-1099663

SUMMARY

Various embodiments are directed to a module type sensor having a new structure capable of assembling the sensor in a simple way of mounting the sensor on a formed with a transmission line for an RF signal, capable of being installed, while maintaining an appropriate distance between the sensor and the transmission line, only with a work of assembling the module type sensor without the need of precisely coaxially arranging the sensor and the transmission line, and capable of easily adjusting the distance between a sensing circuit unit and the transmission line according to the magnitude and frequency of power of the transmission line.

In an embodiment, a module type sensor for detecting a voltage and a current from an RF signal flowing through a transmission line printed on a printed circuit board may include: a casing including a casing upper surface portion which finishes an upper surface, a first casing side surface portion which is bent downward from the casing upper surface portion to form one side surface portion and has a lower end upwardly separated with respect to a path through which the transmission line passes, and a second casing side surface portion which is bent downward from the casing upper surface portion to form the other side surface portion, is supported with respect to the printed circuit board at a lower end and has a fixing bracket extending by being bent toward an outside at the lower end to be fixedly locked to the printed circuit board; a body unit fixedly installed inside the casing, formed of an insulator, supported with respect to the printed circuit board at a lower end, and having, at a center, an opening which is open toward the transmission line; sensing and a substrate unit fixedly installed on an upper portion of the body unit, and including a voltage sensing circuit part which is capacitively coupled to the transmission line exposed through the opening and a current sensing circuit part which is inductively coupled to the transmission line.

In the module type sensor according to another embodiment of the present disclosure, a detection voltage output terminal which vertically communicates with an output terminal of the voltage sensing circuit part and a detection current output terminal which vertically communicates with an output terminal of the current sensing circuit part are disposed on the casing upper surface portion to protrude upward.

In the module type sensor according to further another embodiment of the present disclosure, the detection voltage output terminal and the detection current output terminal are formed in the shape of via holes.

In the module type sensor according to further another embodiment of the present disclosure, the body unit is formed of a material including Teflon.

In the module type sensor according to further another embodiment of the present disclosure, a body unit fixing member, which fixes the upper portion of the body unit in a state in which the upper portion is separated by a predetermined distance from the printed circuit board, is coupled to the casing upper surface portion.

In the module type sensor according to further another embodiment of the present disclosure, the body unit fixing member is a height adjustment bolt which adjusts a height of the upper portion of the body unit.

In the module type sensor according to further another embodiment of the present disclosure, the voltage sensing circuit part includes a voltage sensing plate which includes an opposing e portion extending downward from the sensing substrate unit and bent in a direction parallel to the transmission line at a lower end and which is formed of a conductive material such that the opposing plate portion is capacitively coupled with respect to the transmission line.

In the module type sensor according to further another embodiment of the present disclosure, a first attenuation circuit portion, which attenuates a detection signal of the voltage sensing plate to a predetermined level, is installed between the voltage sensing plate and the output terminal of the voltage sensing circuit part.

In the module type sensor according to further another embodiment of the present disclosure, the current sensing circuit part includes a current sensing inductor which is installed toward the transmission line at a lower portion of the sensing substrate unit and is inductively coupled with respect to the transmission line.

In the module type sensor according to further another embodiment of the present disclosure, a second attenuation circuit portion, which attenuates a detection signal of the current sensing inductor to a predetermined level, is installed between the current sensing inductor and the output terminal of the current sensing circuit part.

According to the module type t sensor for detecting a voltage and a current of an RF signal on a transmission line of a printed circuit board in accordance with the embodiment of the present disclosure, advantages are provided in that the sensor may be assembled in a simple way of mounting the sensor on a PCB formed with a transmission line for an RF signal, the sensor may be installed, while maintaining an appropriate distance between the sensor and the transmission line, only with a work of assembling the module type sensor without the need of precisely coaxially arranging the sensor and the transmission line, and the distance between a sensing circuit unit and the transmission line may be easily adjusted to the magnitude and frequency of power of the transmission line.

DETAILED DESCRIPTION

Figure 1:
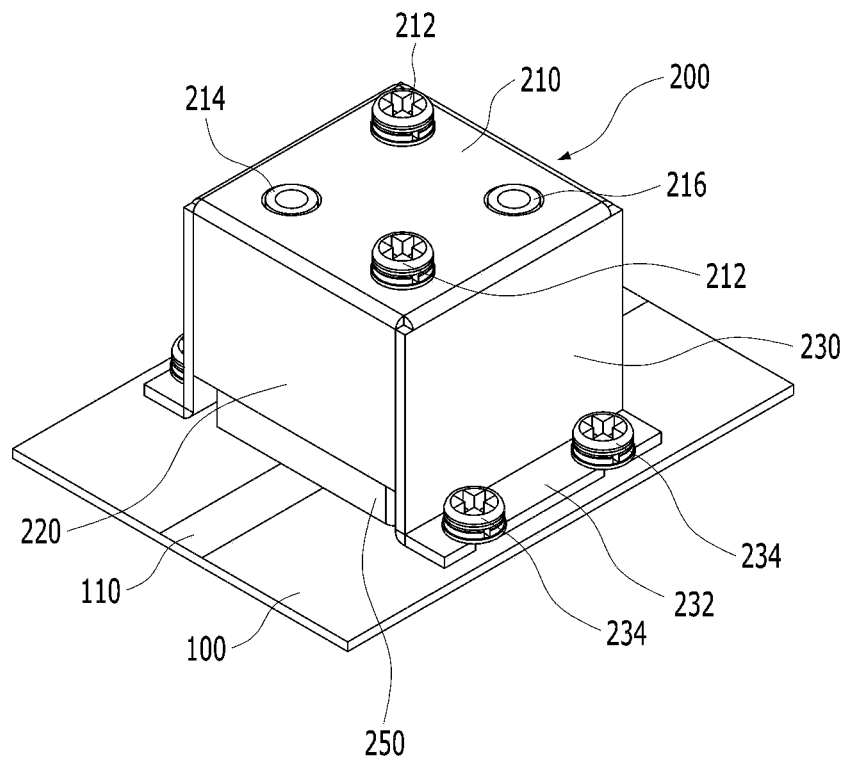
FIG. 1 is a perspective view illustrating a state in which a module type sensor in accordance with an embodiment of the present disclosure is mounted on a PCB.

Hereinafter, embodiments according to the present disclosure will be described in detail with reference to the accompanying drawings. However, it should be understood that there is no intent to limit the present disclosure to particular implementation forms, but on the contrary, the present disclosure covers all modifications, equivalents and alternatives falling within the spirit and scope of the present disclosure.

The same reference numeral is assigned to a portion having a similar element and operation throughout the specification. Furthermore, the accompanying drawings of the present disclosure are for convenience of description, and shapes and relative criteria thereof may be exaggerated or omitted.

In specifically describing the embodiments, a redundant description or a description of a technique evident in a corresponding field has been omitted. Furthermore, in the following description, when it is said that one element "includes" the other element, the word "include" means that the one element may further include an element other than the describe element unless explicitly described to the contrary.

Furthermore, a term, such as " . . . unit", " . . . er (or . . . or)", or " . . . module" described in the specification, means a unit for processing at least one function or operation, and this may be implemented by hardware or software or a combination thereof. Furthermore, when it is described that one part is electrically connected to another part, it should be understood that the two parts may be directly connected to each other, or may be connected to each other with a third part interposed therebetween.

Terms, such as a "first" and a "second", may be used to describe various elements, but the elements are not limited by the terms. The terms are used to only distinguish one element from the other element. For example, a first f element may be named a second element without departing from the scope of a right of the present disclosure. Likewise, a second element may be named a first element.

Figure 2:
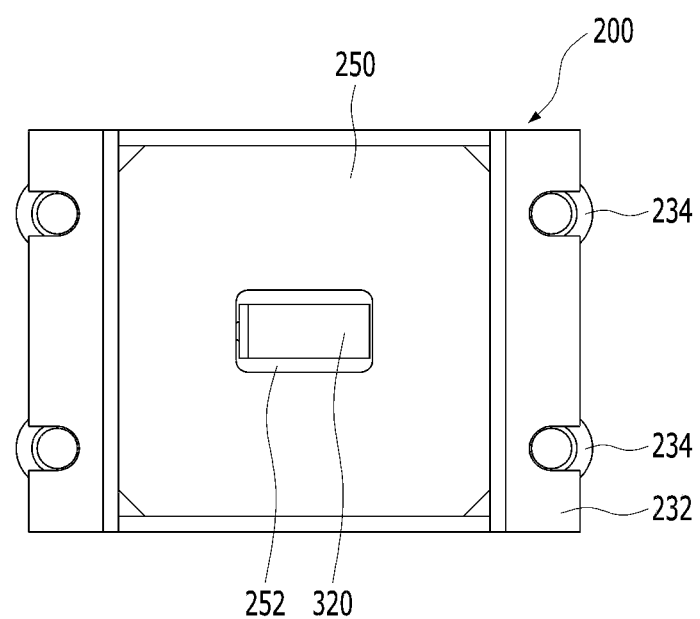
FIG. 2 is a bottom view of the module type sensor in accordance with the embodiment of the present disclosure.
Figure 3:
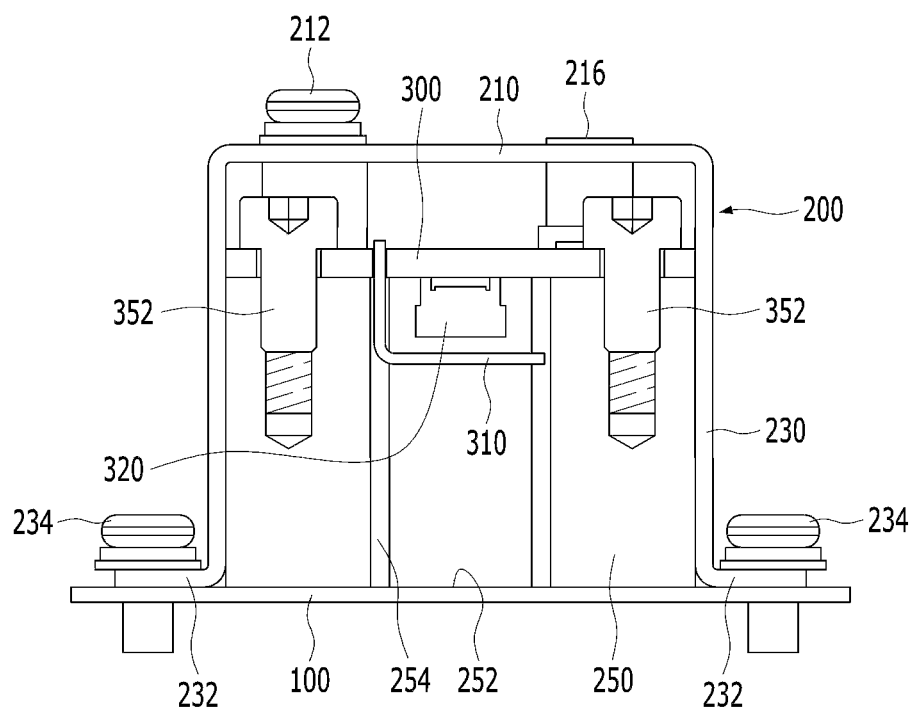
FIG. 3 is a cross-sectional view illustrating the state in which the module type sensor in accordance with the embodiment of the present disclosure is mounted on the PCB.

FIG. 1 is a perspective view illustrating a state in which a module type sensor in accordance with an embodiment of the present disclosure is mounted on a PCB, FIG. 2 is a bottom view of the module type sensor in accordance with the embodiment of the present disclosure, and FIG. 3 is a cross-sectional view illustrating the state in which the module type sensor in accordance with the embodiment of the present disclosure is mounted on the PCB. The structure of the module type sensor in accordance with the embodiment of the present disclosure will be described below with reference to FIGS. 1 to 3.

Referring to FIG. 1, the module type sensor in accordance with the embodiment of the present disclosure is provided in a form capable of being attached to or detached from a PCB 100 on the upper of which a transmission line 110 for surface transmitting an RF signal is patterned. As described above in the background, the transmission line 110 may be a line which transmits high-frequency power from a high-frequency power supply device to a plasma load. Of course, the transmission line 110 may be any other line which transmits an RF signal from a power source to a load.

The module type sensor in accordance with the embodiment of the present disclosure, as a sensor module 200 capable of being assembled to the PCB 100, includes a casing 210, 220 and 230, a body unit 250, and a sensing substrate unit 300.

The casing 210, 220 and 230 may have a hexahedral shape with an open lower portion, and includes a casing upper surface portion 210, a casing first side surface portion 220 and a casing second side surface portion 230.

The casing upper surface portion 210 is a component which finishes the upper surface of the sensor module 200. As illustrated in FIG. 1, body unit fixing means 212, a detection voltage output terminal 214 and a detection current output terminal 216 are disposed to be exposed through the casing upper surface portion 210.

The casing first side surface portion 220 is bent downward from the casing upper surface portion 210 to have the shape of opposing plates, and forms one side surface portion of the sensor module 200. As illustrated, the lower end of the casing first side surface portion 220 is formed to be upwardly separated with respect to a path through which the transmission line 110 passes. Therefore, even when the casing 210, 220 and 230 is made of a metal material, an insulation state may be maintained for the transmission line 110.

The casing second side surface portion 230 is bent downward from the casing upper surface portion 210 in a different direction to have the shape of opposing plates, and forms the other side surface portion of the sensor module 200. As illustrated, the lower end of the casing second side surface portion 230 is parallel to the transmission line 110 and is supported with respect to the upper surface of the PCB 100.

A fixing bracket 232, which is bent toward the outside of the casing 210, 220 and 230 and extends by being supported by the PCB 100, is provided at the lower end of the casing second side surface portion 230. Casing fixing means 234 is locked to pass through the fixing bracket 232 and the PCB 100. For example, the casing fixing means 234 is locking means such as a bolt, a screw or a rivet.

Referring to the cross-sectional view of FIG. 3, by locking the fixing bracket 232 to the PCB 100, the sensor module 200 may be installed to be securely fixed while the casing 210, 220 and 230 of the sensor module 200 maintains an insulated state with respect to the transmission line 110.

The body unit 250 is composed of an insulator which is fixedly installed inside the casing 210, 220 and 230. The body unit 250 is supported with respect to the upper surface of the PCB 100 at the lower end thereof, and includes, at the center thereof, an opening 252 which is open toward the transmission line 110. For example, the body unit 250 is formed of a material including Teflon.

Referring to FIG. 3, the body unit fixing means 212 is locked through the casing upper surface portion 210. The body unit fixing means 212 fixes the body unit 250 at a predetermined height in the casing 210, 220 and 230. For example, the body unit fixing means 212 is locking means such as a bolt, a screw or a rivet. The body unit fixing means 212 may be composed of a height adjustment bolt which has a tool engagement groove on the head portion thereof. In this case, the height of the upper portion of the body unit 250 with respect to the PCB 100 may be adjusted by engaging a tool into the head portion of the body unit fixing means 212 and rotating the tool.

Referring to FIG. 3, an inner pillar 254 is formed at the center of the body unit 250, and a space for sensing a voltage and a current is formed from the opening 252 formed at the lower end of the inner pillar 254 to the upper end of the inner pillar 254.

The sensing substrate unit 300 is fixedly installed on the upper portion of the body unit 250. As illustrated, sensing substrate unit fixing means 352 which fixes the sensing substrate unit 300 with respect to the body unit 250 is installed at the periphery of the sensing substrate unit 300. For example, the sensing substrate unit fixing means 352 is locking means such as a bolt, a screw or a rivet.

The sensing substrate unit 300 includes a voltage sensing which is capacitively coupled to the circuit part 360 transmission line 110 exposed through the opening 252 and a current sensing circuit part 370 which is inductively coupled to the transmission line 110 exposed through the opening 252.

As illustrated, the detection voltage output terminal 214 which vertically communicates with the output terminal of the voltage sensing circuit part 360 is disposed on the casing upper surface portion 210 to protrude upward. Further, the detection current output terminal 216 which vertically communicates with the output terminal of the current sensing circuit part 370 is disposed on the casing upper surface portion 210 to protrude upward. The detection voltage output t terminal 214 and the detection current output terminal 216 may be formed in the shape of via holes.

Figure 4:
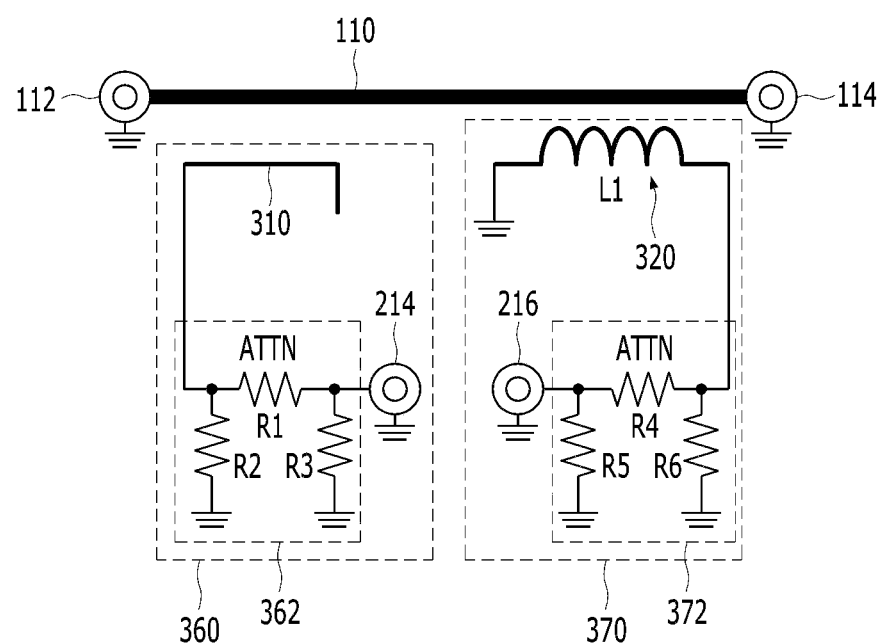
FIG. 4 is a circuit diagram illustrating the circuit structure of a sensing unit of the module type sensor in accordance with the embodiment of the present disclosure.

FIG. 4 is a circuit diagram illustrating the circuit structure of a sensing unit of the module type sensor in accordance with the embodiment of the present disclosure. A circuit configuration for detecting, in the sensing substrate unit 300, the voltage and current of an RF signal which flows through the transmission line 110 will be described below with reference to FIG. 4.

Referring to FIG. 4, an equivalent circuit configuration of the transmission line 110 is illustrated above. The transmission line 110 means a line which connects an RF input terminal 112 and an RF output terminal 114. The transmission line 110 may be any one of RF signal transmission lines of a plasma power supply system, or may be any one of other lines which transmit an RF signal.

The voltage sensing circuit part 360 includes a voltage sensing plate 310 and a first attenuation circuit portion 362.

The voltage sensing plate 310 includes an opposing plate portion which extends downward from the sensing substrate unit 300 and is bent in a direction parallel to the transmission line 110 at the lower end thereof, as illustrated in the cross-sectional view of FIG. 3. The voltage sensing plate 310 is made of a conductive metal material having high conductivity, such as copper. Referring to the cross-sectional view of FIG. 3, since the opposing plate portion of the voltage sensing plate 310 is in a state in which it is separated by a predetermined distance from the transmission line 110, the two conductors are capacitively coupled. Therefore, between the opposing plate portion and the transmission line 110, a capacitance that is inversely proportional to a separation distance and is proportional to an opposing area is generated. A detection voltage corresponding to the voltage component of a signal which passes through the transmission line 110 is generated between the detection voltage output terminal 214 and the ground by the charges accumulated in the capacitance.

The first attenuation circuit portion 362 is a circuit which attenuates the detection signal of the voltage sensing plate 310 to a predetermined level. The first attenuation circuit portion 362 may be configured by a first resistor R1 which is connected in series between the voltage sensing plate 310 and the detection voltage output terminal 214 and a second resistor R2 and a third resistor R3 which are branched in parallel at both ends of the first resistor R1 and are connected to the ground. The first attenuation circuit portion 362 attenuates a voltage component which is detected by the voltage sensing plate 310, to a voltage level for measurement.

The current sensing circuit part 370 includes a current sensing inductor 320 and a second attenuation circuit portion 372.

The current sensing inductor 320 is an inductor which is installed toward the transmission line 110 from the lower surface of the sensing substrate unit 300, as illustrated in the cross-sectional view of FIG. 3. For example, the current sensing inductor 320 may be configured by a chip inductor. The current sensing inductor 320 is inductively coupled to the transmission line 110. Therefore, a detection current corresponding to the current component of a signal which flows through the transmission line 110 is induced in the current sensing inductor 320.

The second attenuation circuit portion 372 is a circuit which attenuates the detection signal of the current sensing inductor 320 to a predetermined level. The second attenuation circuit portion 372 may be configured by a fourth resistor R4 which is connected in series between the current sensing inductor 320 and the detection current output terminal 216 and a fifth resistor R5 and a sixth resistor R6 which are branched in parallel at both ends of the fourth resistor R4 and are connected to the ground. The second attenuation circuit portion 372 attenuates a current component which is detected by the current sensing inductor 320, to a current level for measurement.

The disclosed disclosure may be modified in various ways within a range that does not impair a basic spirit of the present disclosure. That is, all the embodiments should be interpreted as being illustrative and are not interpreted as being limitative. Accordingly, the scope of protection of the present disclosure should be determined by the accompanying claims, not the above embodiments. If a limited element in the accompanying claims is substituted with an equivalent thereto, the substitution should be construed as belonging to the scope of the protection of the present disclosure.

What is claimed is:

1. A module type sensor for detecting a voltage and a current from a radio frequency (RF) signal, comprising:
   a printed circuit board on which a transmission line is printed such that the RE signal flows through the transmission line;
   a casing configured to be installed on the printed circuit board, and including:
      a casing upper surface portion which finishes an upper surface,
      a first casing side surface portion which is bent downward from the casing upper surface portion to form one side surface portion and has a lower end upwardly separated with respect to a path through which the transmission line passes,
      a second casing side surface portion which is bent downward from the casing upper surface portion to form the other side surface portion, and has a fixing bracket extending by being bent toward an outside at the lower end, and
      casing fixing means configured to fixedly lock the casing on the printed circuit board;
   a body unit configured to be fixedly installed inside the casing, formed of an insulator, and having, at a center, an opening which is open toward the transmission line; and
   a sensing substrate unit configured to be fixedly installed on an upper portion of the body unit, and including a voltage sensing circuit part which is capacitively coupled to the transmission line exposed through the opening and a current sensing circuit part which is inductively coupled to the transmission line.

2. The module type sensor according to claim 1, wherein a detection voltage output terminal which vertically communicates with an output terminal of the voltage sensing circuit part and a detection current output terminal which vertically communicates with an output terminal of the current sensing circuit part are disposed on the casing upper surface portion to protrude upward.

3. The module type sensor according to claim 2, further comprising:
   a body unit fixing member configured to fix the upper portion of the body unit to the casing upper surface portion such that the printed circuit board is separated from the casing upper surface portion by a predetermined distance.

4. The module type sensor according to claim 2, wherein the detection voltage output terminal and the detection current output terminal are formed in the shape of via holes.

5. The module type sensor according to claim 4, further comprising:
   a body unit fixing member configured to fix the upper portion of the body unit to the casing upper surface portion such that the printed circuit board is separated from the casing upper surface portion by a predetermined distance.

6. The module type sensor according to claim 1, wherein the body unit is formed of a material including Teflon.

7. The module type sensor according to claim 6, further comprising:
   a body unit fixing member configured to fix the upper portion of the body unit to the casing upper surface portion such that the printed circuit board is separated from the casing upper surface portion by a predetermined distance.

8. The module type sensor according to claim 1, further comprising:
   a body unit fixing member configured to fix the upper portion of the body unit to the casing upper surface portion such that the printed circuit board is separated from the casing upper surface portion by a predetermined distance.

9. The module type sensor according to claim 8, wherein the body unit fixing member is a height adjustment bolt which adjusts a height of the upper portion of the body unit.

10. The module type sensor according to claim 1, wherein the voltage sensing circuit part includes a voltage sensing plate which includes an opposing plate portion extending downward from the sensing substrate unit and bent in a direction parallel to the transmission line at a lower end and which is formed of a conductive material such that the opposing plate portion is capacitively coupled with respect to the transmission line.

11. The module type sensor according to claim 10, wherein a first attenuation circuit portion, which attenuates a detection signal of the voltage sensing plate to a predetermined level, is installed between the voltage sensing plate and the output terminal of the voltage sensing circuit part.

12. The module type sensor according to claim 1, wherein the current sensing circuit part includes a current sensing inductor which is installed toward the transmission line at a lower portion of the sensing substrate unit and is inductively coupled with respect to the transmission line.

13. The module type sensor according to claim 12, wherein a second attenuation circuit portion, which attenuates a detection signal of the current sensing inductor to a predetermined level, is installed between the current sensing inductor and the output terminal of the current sensing circuit part.

* * * * *